United States Patent [19]
Utsu et al.

[11] Patent Number: 5,343,172
[45] Date of Patent: Aug. 30, 1994

[54] VARIABLE REACTANCE CIRCUIT FOR MICROWAVE OR MILLIMETER WAVE BAND AND VARIABLE MATCHING CIRCUIT USING VARIABLE REACTANCE CIRCUIT

[75] Inventors: Junsi Utsu, Oobu; Seishin Mikami, Toyota; Masao Kodera, Okazaki, all of Japan

[73] Assignee: Nippondenso Co., Ltd., Kariya, Japan

[21] Appl. No.: 997,305

[22] Filed: Dec. 23, 1992

[30] Foreign Application Priority Data

Dec. 24, 1991 [JP] Japan .................................. 3-340776
Dec. 4, 1992 [JP] Japan .................................. 4-325178

[51] Int. Cl.$^5$ .......................... H03H 7/38; H03F 3/16
[52] U.S. Cl. ................................ 333/32; 307/304; 330/277; 333/217
[58] Field of Search ................ 333/32, 33, 213, 214, 333/216, 217; 330/277, 286; 307/264, 490, 304

[56] References Cited

U.S. PATENT DOCUMENTS

| | | | |
|---|---|---|---|
| 4,338,582 | 7/1982 | Presser | 333/217 X |
| 4,963,773 | 10/1990 | Ayasli | 307/304 X |
| 4,965,547 | 10/1990 | Ryan | 307/304 X |
| 4,987,384 | 1/1991 | Yamanouchi et al. | 330/277 X |

FOREIGN PATENT DOCUMENTS

| | | |
|---|---|---|
| 56-99914 | 8/1981 | Japan . |
| 57-37808 | 3/1982 | Japan . |
| 59-216307 | 12/1984 | Japan . |
| 1318310 | 12/1989 | Japan . |
| 2261206 | 10/1990 | Japan . |

Primary Examiner—Paul Gensler
Attorney, Agent, or Firm—Cushman, Darby & Cushman

[57] ABSTRACT

Series reactance elements constituted by capacitors are connected to an input side corresponding to the gate electrode of an amplifying FET and an output side corresponding to the drain electrode of the amplifying FET, respectively. Parallel variable reactance circuits are connected to the input and output sides, respectively. Each variable reactance circuit includes a FET, where the source electrodes of the FET are connected to the input and output sides through MIM capacitors, respectively. Additionally, drain electrodes of the FETs are grounded through inductive loads which are constituted by spiral inductors, respectively. The source electrodes of the FETs constituting the variable reactance circuits are grounded through choke coils, respectively. The drain electrodes of the FETs receive control bias voltages through the choke coils, respectively. In this case, each of the resistive components of the spiral inductors is set to have a value which can cancel the negative resistive component of the corresponding FET.

11 Claims, 3 Drawing Sheets

VARIABLE REACTANCE CIRCUIT FOR MICROWAVE OR MILLIMETER WAVE BAND AND VARIABLE MATCHING CIRCUIT USING VARIABLE REACTANCE CIRCUIT

BACKGROUND OF THE INVENTION

1. Field of the Invention

The present invention relates to a variable reactance circuit which combines an electrical adjusting means to an integrated circuit for an microwave or millimeter wave band (to be referred to as an MIC hereinafter). More particularly, the present invention relates to a variable matching circuit which incorporates the variable reactance circuit.

2. Description of the Related Art

In a circuit device used in an ultra-high-frequency band such as a microwave band or a millimeter wave band, when circuit elements are not preferably matched with each other, a satisfactory circuit function cannot be obtained. However, as a frequency for the signal input to the circuit device is increased, variations in characteristics of the circuit elements and circuit losses tend to increase. For this reason, in a monolithic MIC which includes fixed elements to which post adjustment cannot be performed, a problem is posed, i.e., a low yield disables practical applications of the monolithic MIC.

To overcome such problems, a conventional technique which incorporates a hybrid MIC to which post adjustment can be performed via bonding is commonly used. However, since the hybrid MIC is a distributed constant circuit constituted by micro-strip lines, the hybrid MIC requires a magnitude which is much higher than a lumped constant, where the hybrid MIC is not suitable for mass production. For this reason, an adjusting mechanism for a monolithic MIC is in demand.

Accordingly, an adjusting mechanism and a short-circuiting mechanism are considered. Such an adjusting mechanism uses the bias voltage dependency of the input impedance of a field effect transistor (FET), and such means for selectively short-circuiting spiral inductor lines use a switching mechanism to adjust inductance values. However, in the adjusting mechanism an amplifying FET cannot be used under a bias voltage condition which is optimally suitable for amplification. For that reason degradation of circuit performance is posed as a problem. In addition, undesired losses caused by the resistors of the spiral inductors themselves are experienced in the switching mechanism.

A mechanism for adjusting a capacitance by a varactor, a mechanism for adjusting a reactance by the resonance of a varactor, and a spiral inductor are therefore considered to overcome such problems. However, the adjusting mechanism using the varactor has the following problems: the variable range of the varactor is limited, and a bias voltage for varying the capacitance must be high.

FIG. 6A shows an ideal amplifying circuit designed by conventionally known reactance elements, each having a loss. This amplifying circuit comprises input and output matching circuits, each constituted by an amplifying FET 51, reactances 52 and 53 which are respectively series-connected to the gate and drain of the FET 51, and parallel reactances 54 and 55.

As described above, although the matching circuit requires reactance elements, the types of reactance elements which can be actually used in a monolithic MIC are limited. More specifically, a spiral inductor only serving as a lumped-constant inductive reactance element has a serious problem in that a loss caused by the resistance of a line cannot be neglected. Therefore, the matching circuit cannot be formed into a monolithic MIC without any change. For this reason, a hybrid MIC having a distributed constant arrangement which can realize an arbitrary reactance with a low loss is popularly used.

FIG. 6B shows an amplifying circuit constituted by the above hybrid MIC. Strip lines 62 and 63 which are connected to an amplifying FET 61 constitute an input matching reactance circuit. Strip lines 64 and 65 constitute an output matching reactance circuit. In addition, in the hybrid MIC, the input and output matching circuits can be post-adjusted by bonding adjusting patterns 631 and 651. Therefore, the degradation of performance caused by variations in characteristic of the FET 61 can be corrected. However, a physical adjusting mechanism which operates based on bonding is not suitable for mass production, so that it cannot be applied to the monolithic MIC. For this reason, an electrical adjusting means capable of automatically performing the adjustment is required.

SUMMARY OF THE INVENTION

It is an object of the present invention to provide a variable reactance circuit capable of realizing an arbitrary reactance on a monolithic MIC with a low loss.

It is another object of the present invention to provide a variable reactance circuit in which electrical adjustment can be automatically performed to match circuit elements with each other, thereby increasing the yield of monolithic MICs.

It is still another object of the present invention to provide a variable matching circuit arranged such that an amplifier having an automatic matching function is constituted by the variable reactance circuit obtained as described above.

In a variable reactance circuit according to the present invention, an inductive load is connected between the drain electrode of a gate-grounded field effect transistor and ground. Therefore, the inductive load has a resistive component value which can cancel a negative resistance corresponding to a source input impedance of the field effect transistor and an adjustable bias voltage applying means applies a bias voltage to the field effect transistor.

In the variable reactance circuit arranged as described above, the inductive load connected to the drain of the field effect transistor is constituted by, e.g., a spiral inductor, where the spiral inductor has a loss corresponding to the resistance of a line. On the other hand, the gate-grounded field effect transistor having the drain connected to the inductive load has the negative resistive component. Therefore, the field effect transistor is equivalent to a parallel circuit of the negative resistive component and a gate-source capacitive component. The value of the negative resistive component depends on the value of the inductance component of the inductive load. Therefore, when the value of the spiral inductor is selected, the negative resistive component of the field effect transistor can cancel out the resistive component of the spiral inductor. Thus, the resulting circuit can be regarded as a parallel circuit of the gate-source capacitive component and the inductive component of the spiral inductor. Since the gate-source capacitive component has bias voltage dependency, the parallel circuit serves as a variable reactance circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
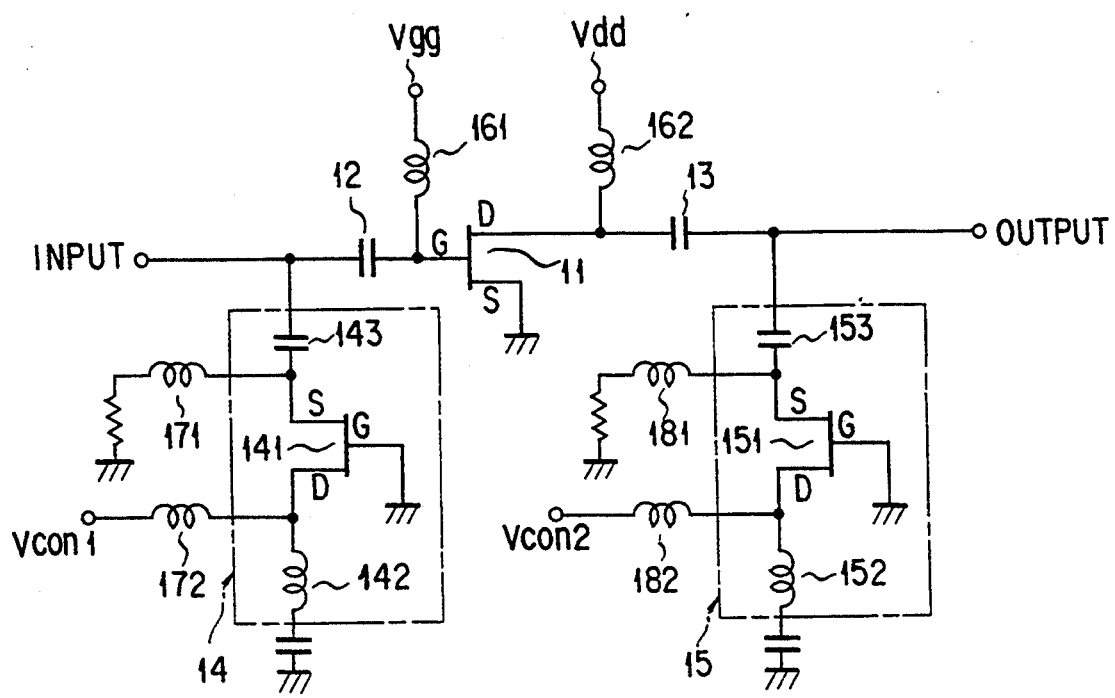
FIG. 1 is a circuit diagram showing an amplifying circuit constituted by a monolithic MIC using variable reactance circuits according to an embodiment of the present invention.

FIG. 1 shows a monolithic amplifying circuit which uses variable reactance circuits as a matching circuit, where the amplifying circuit includes an amplifying field effect transistor (FET) 11. Series reactance elements 12 and 13 which are constituted by capacitors are positioned between and connected to an input side corresponding to the gate electrode and to the output side corresponding to the drain electrode of the amplifying field effect transistor 11, respectively. Parallel variable reactance circuits 14 and 15 are connected to the input and output sides, respectively. The matching circuit is thus constituted by the reactance circuits 12 to 15.

The variable reactance circuit 14 set on the input side comprises a gate-grounded FET 141, an inductive load constituted by a spiral inductor 142 which is connected to the drain electrode of the gate-grounded FET 141, and the source electrode of the gate-grounded FET 141 which is connected to the input side of the amplifying FET 11 through an MIM capacitor 143. The variable reactance circuit 15 set on the output side comprises a gate-grounded FET 151 as in the variable reactance circuit 14 of the input side, an inductive load constituted by a spiral inductor 152 which is connected to the drain electrode of the FET 151, and the source electrode of the FET 151 which is connected to the output side of the amplifying FET 11 through an MIM capacitor 153.

Bias voltage Vgg and Vdd are applied to the gate and drain electrodes of the amplifying FET 11 through choke coils 161 and 162, respectively. The source electrodes of the FETs 141 and 151 which constitute variable reactance circuits 14 and 15 are grounded through choke coils 171 and 181, respectively. Further control bias voltages Vcon1 and Vcon2 are applied to the drain electrodes of the FETs 141 and 151 through choke coils 172 and 182, respectively.

Figure 2A:
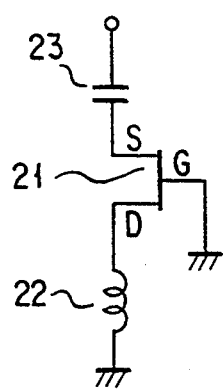
FIG. 2A is a circuit diagram showing a variable reactance circuit used in the embodiment while a bias voltage circuit is omitted.

FIG. 2A shows each of the variable reactance circuits 14 and 15 corresponding to the above-mentioned amplifying circuits while a bias voltage circuit is not shown. The drain electrode of a gate-grounded FET 21 is grounded through a spiral inductor 22, where the spiral inductor forms an inductive load. The source electrode of the gate-grounded FET 21 is connected to an MIM capacitor 23.

Figure 2B:
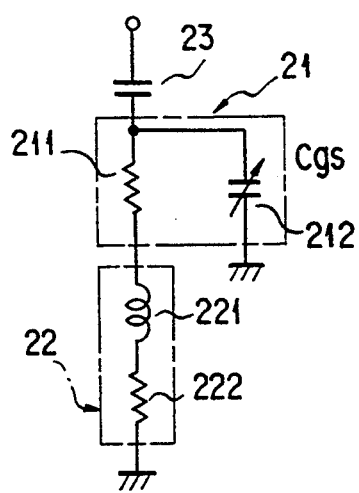
FIG. 2B is a circuit diagram of an equivalent circuit of the variable reactance circuit.

Since the MIM capacitor 23 in the monolithic element constituting the variable circuit has a low loss, the MIM capacitor 23 is not changed in expression from the equivalent circuit shown in FIG. 2B. However, since the spiral inductor 22 has a high loss, as shown in the equivalent circuit in FIG. 2B, the spiral inductor 22 is represented by an equivalent series circuit combining an ideal inductance 221 and a resistance 222. In addition, the gate-grounded FET 21 having a drain electrode which is connected to the inductive load of spiral inductor 22 has a negative resistive component. Therefore, as shown in the equivalent circuit of FIG. 2B, the gate-grounded FET 21 is equivalent to a parallel circuit having a negative resistor 211 and a gate-source capacitor 212.

Figure 2C:
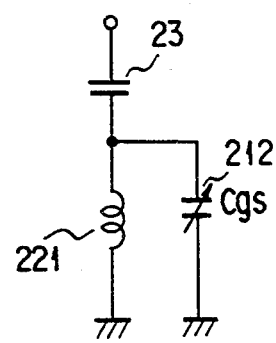
FIG. 2C is a circuit diagram of an equivalent circuit showing a state in which a resistive component is canceled in the equivalent circuit in FIG. 2B.

In this case, the value of the negative resistor 211 corresponding to the gate-grounded FET 21 depends on the value of the inductance 221 connected to the drain electrode of the FET 21. Therefore, when the value of the spiral inductor 22 is properly selected, the negative resistor 211 of the FET 21 can cancel out the resistor 222 set in the spiral inductor 22. The equivalent circuit in this state is shown in FIG. 2C. At this time, the input impedance of the equivalent circuit shown in FIG. 2C is given by the following expression:

$$j\left[\frac{\omega L}{1 - \omega^2 L C_{gs}} - \frac{1}{\omega C}\right]$$

wherein L represents inductance of inductance 221, C represents the capacity of capacitor 23, and $C_{gs}$ represents the capacity of gate-source capacitor 212.

Figure 3:
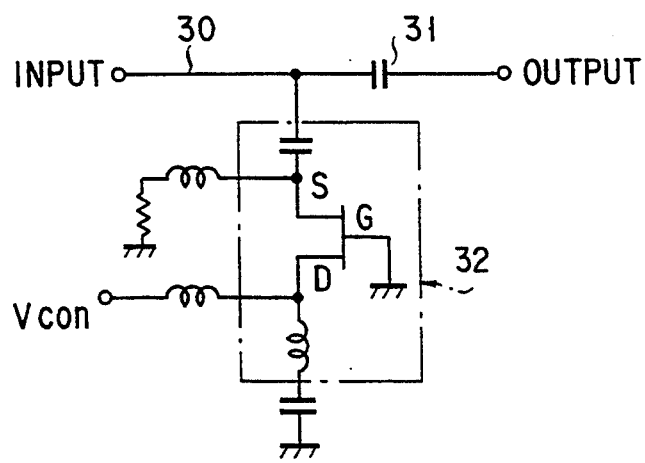
FIG. 3 is a circuit diagram for explaining a variable matching circuit.

According to this expression, it can be understood that a pure reactance having an arbitrary value can be obtained by adjustment of a gate-source capacitance Cgs using bias voltages. Therefore, in the circuit in FIG. 2A equivalent to the circuit in FIG. 2C, a variable reactance circuit can be constituted. As shown in FIG. 3, when a variable reactance circuit 32 is set and parallelly combined with a series reactance 31, a variable matching circuit having a very low loss can be constituted like a matching micro-strip reactance circuit shown in FIG. 6B which is constituted by strip lines 62, 63, 64, and 65.

Figure 6A:
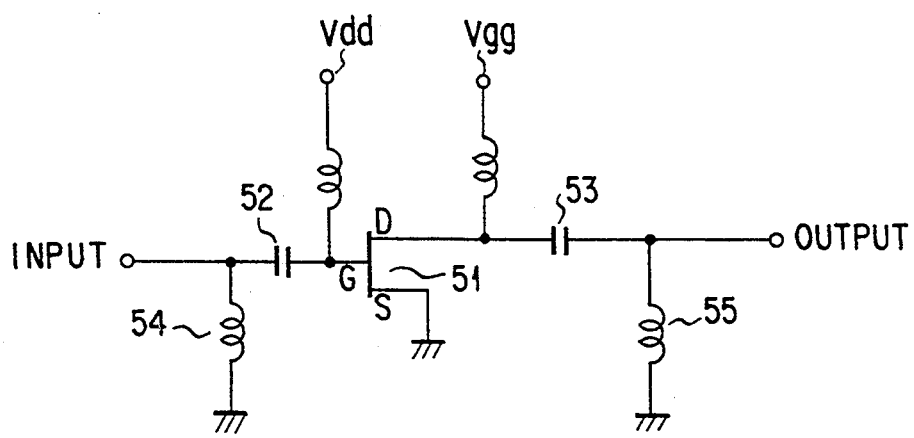
FIGS. 6A and 6B are views showing conventional variable reactance circuits, respectively.
Figure 6B:
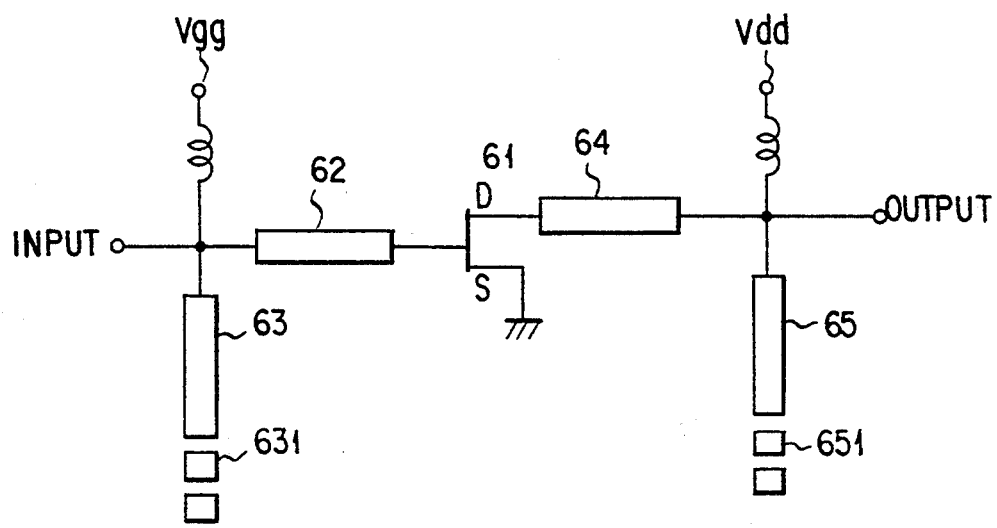

Therefore, the monolithic MIC amplifying circuit shown in FIG. 1 which is constituted by the above variable matching circuit having variable reactance circuits 14 and 15 can obtain almost the same performance as that of the ideally designed circuit shown in FIG. 6A. Thus a decrease in yield caused by the variations in characteristics of FETs used in the monolithic MIC amplifying circuit can be suppressed by post adjustment.

Figure 4:
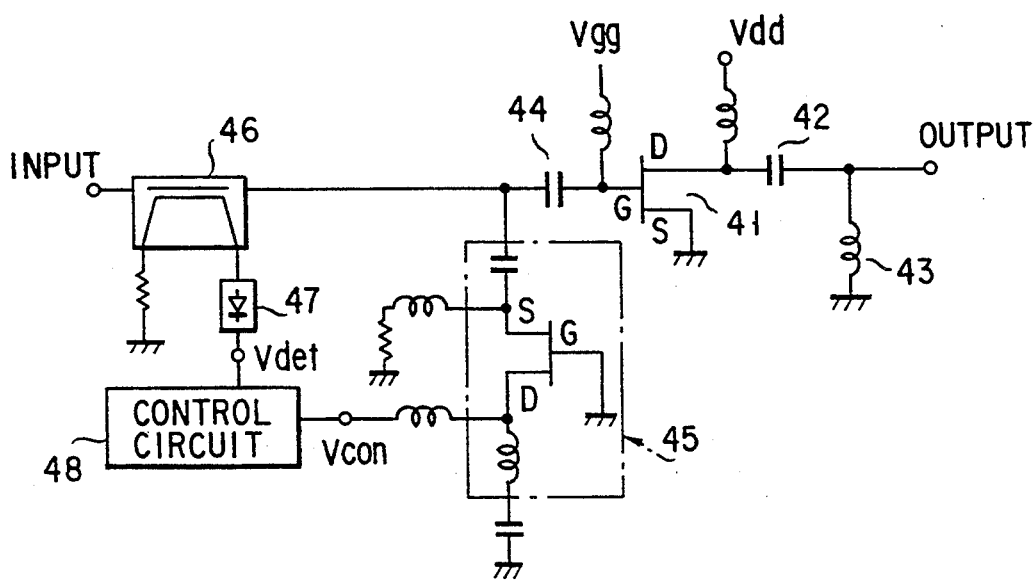
FIG. 4 is a circuit diagram for explaining an amplifier using the variable matching circuit constituted by the variable reactance circuit.

When the above variable reactance circuits are used, for example, an amplifier can be constructed having an automatic matching function such as that shown in FIG. 4. This amplifier comprises an amplifying source-grounded field effect transistor (FET) 41, and an output matching circuit, where the output matching circuit is constituted by the combination of a series reactance 42 and a parallel reactance 43 where the parallel reactance is connected to the drain electrode of the FET 41. An input matching circuit constituted by a series reactance 44 and a parallel variable reactance circuit 45 is connected to the gate electrode of the FET 41. A directional coupler 46 for extracting a reflection power is arranged on the input side of the amplifier as described above, and a signal branched and coupled by the coupler 46 is detected by a power detector 47. A detection output Vdet from the power detector 47 is supplied to a control circuit 48. The control circuit 48 outputs a signal Vcon for controlling the bias voltage of the variable reactance circuit 45.

Figure 5:
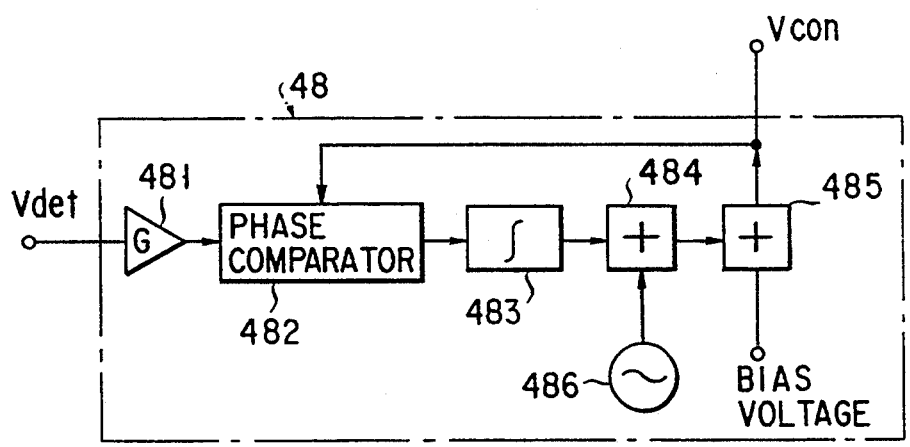
FIG. 5 is a view showing an arrangement for explaining a control circuit used in the amplifier.

FIG. 5 shows a detailed arrangement of the control circuit 48. The detection output Vdet is amplified by a low-frequency amplifier 481 and supplied to a phase comparator 482. An output from the low-frequency amplifier 481 is integrated by an integrated circuit 483 and supplied to adders 484 and 485. An output from a low-frequency oscillator 486 is supplied to the adder 484, and an initial bias voltage is applied to the adder 485, and the control output Vcon is output from the adder 485, and control output Vcon is supplied as a comparison signal to the phase comparator 482.

An operation of the control circuit 48 will be described as follows. An output from the oscillator 486 is added to the initial bias voltage to change the bias voltage Vcon of the variable reactance circuit 45. In this manner, when the bias voltage Vcon is changed, since the input impedance of the amplifier is changed to change the reflection power, the detection output voltage Vdet from the detector 47 is changed at the same frequency. At this time, when the initial bias voltage is lower than an optimal bias voltage in a matching state, since the reflection power is decreased in accordance with the positive change in bias voltage Vcon. Therefore the change in detection output voltage Vdet has a phase opposite to the bias voltage change. In addition, when the initial bias voltage is higher than the optimal bias voltage, the change in detection output Vdet has the same phase as that of the bias voltage change.

In the phase comparator 482, the phase of the output voltage Vdet from the detector 47 is compared with that of the bias voltage Vcon. At this time, a positive voltage is output when the compared voltages have phases opposite to each other, and a negative voltage is output when the compared voltages have the same phase. For this reason, when the bias voltage Vcon is lower than the optimal bias voltage, an output from the integrated circuit 483 is increased, and the bias voltage output Vcon to which the output from the integrated circuit 483 is to be added becomes higher than the initial bias voltage to be close to the optimal bias voltage. In addition, when the bias voltage output Vcon is higher than the optimal bias voltage, the bias voltage output Vcon becomes close to the optimal bias voltage. This occurs because the output from the integrated circuit 483 is decreased, as in the case wherein the bias voltage Vcon is lower than the optimal bias voltage, the bias voltage output Vcon becomes close to the optimal bias voltage.

In other words, the control circuit 48 has a function of automatically, optimally adjusting the bias voltage of the variable reactance circuit 45 independently of the value of the initial bias voltage. Therefore the amplifier shown in FIG. 4 and constituted by the control circuit 48 need not be adjusted.

In the same manner as described above, a directional coupler is arranged on the output side of the amplifier shown in FIG. 4, an output voltage is partially extracted by the directional coupler, and the bias voltage of the output matching variable reactance circuit is controlled to maximize the power of the extracted voltage. In this case, the bias voltage of the output side of the variable reactance circuit can be automatically matched.

As described above, the variable reactance circuit described in the above embodiment can be used as a matching circuit in, e.g., a monolithic MIC. Thus, a reactance having an arbitrary value with a low loss, and can be electrically adjusted, thereby considerably increasing the yield of the monolithic MICs.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

We claim:

1. A variable reactance circuit for a microwave or millimeter wave band, comprising:
   a gate-grounded field effect transistor having an inherent resistive component and an inherent gate-source capacitance, where said inherent gate-source capacitance changes in accordance with a level of bias voltage applied to said transistor;
   an inductive load arranged between a drain electrode of said transistor and a ground point, where said inductive load combines with said inherent resistive component of said transistor to substantially generate a purely reactive input impedance;
   a source capacitor connected to a source electrode of said transistor; and
   adjustable bias voltage applying means for setting a bias voltage applied to said field effect transistor, thereby adjusting said substantially reactive impedance generated by said combination of said inductive load and said transistor.

2. A circuit according to claim 1, wherein said inductive load is constituted by a spiral inductor.

3. A circuit according to claim 1, wherein said gate-grounded field effect transistor has a negative resistive component, and said field effect transistor is equivalent to a parallel circuit of the negative resistive component and a capacitive component between a gate and a source of said transistor.

4. A circuit according to claim 1, wherein the capacitance between said gate and source of said field effect transistor has bias voltage dependency.

5. A circuit according to any of claims 1 to 3 and 4, wherein an input impedance of said variable reactance circuit is set by the following expression:

$$j\left[\frac{\omega L}{1-\omega^2 L C_{gs}} - \frac{1}{\omega C}\right]$$

wherein L represents inductance of said inductive load, C represents capacity of said source capacitor, and $C_{gs}$ represents the capacity of said inherent gate-source capacitance.

6. A variable matching circuit for a microwave or millimeter wave band, comprising:

a reactance element series-connected to a transmission path;

a variable reactance circuit having a gate grounded field effect transistor, where a capacitance is formed between a source electrode of said transistor and said transmission path, where an inductive load is arranged between a drain electrode of said field effect transistor and a ground point, where a negative resistive component of a source input impedance within said transistor is cancelled by a resistive component of said inductive load and said reactance is variable in accordance with a bias voltage; and means for applying and adjusting said bias voltage to said field effect transistor.

7. A variable matching circuit for a microwave or millimeter wave band, comprising:

an amplifying field effect transistor having a gate to which an input signal is supplied through a first series reactance element, and a drain from which an output signal is extracted through a second series reactance element;

first and second variable reactance circuits connected between an input side of said first series reactance element and ground and between an output side of said second series reactance element and ground, respectively; and said first and second variable reactance circuits each having a gate-grounded field effect transistor having an inherent negative resistive component, an inductive load, connected between a ground point and a drain electrode of a corresponding one of said gate-grounded field effect transistors and set to generate a resistance which cancels said negative resistive component of the corresponding one of said gate-grounded field effect transistors, and adjustable bias voltage applying means for setting a bias voltage applied to the corresponding one of said gate-grounded field effect transistors.

8. A variable reactance circuit for a microwave or millimeter wave band, comprising:

a gate-grounded field effect transistor;

an inductive load constituted by a spiral inductance which is arranged between a drain electrode of said field effect transistor and a ground point, an impedance of said inductive load having a resistive component value cancelling a negative resistive component of said field effect transistor, thereby generating a substantially pure reactance;

a capacitor connected to a source electrode of said field effect transistor; and adjustable bias applying means for setting a bias to be applied to said field effect transistor.

9. A variable matching circuit for a microwave or millimeter wave band, comprising:

a reactance element connected in series to a transmission line;

a variable reactance circuit having a gate grounded field effect transistor, having a source electrode connected to said transmission line, where an inductive load is arranged between a drain electrode of said field effect transistor and a ground point, where a negative resistive component of a source input impedance within said transistor is cancelled by a resistive component of said inductive load; and bias voltage applying means for applying and adjusting a bias voltage applied to said transistor, where said bias voltage applying means comprises:

low-frequency generating means for finely changing a bias voltage applied to said transistor at low frequencies;

detecting means for detecting a signal component of said transmission line;

phase comparing means for comparing a phase of said detected signal component of said transmission line with a phase of said bias voltage and for generating an output based on that comparison;

integrating means for integrating said output from said phase comparing means; and adding means for adding an output from said integrating means to an initial bias voltage.

10. A variable matching circuit a for a microwave or millimeter wave band, comprising:

a reactance element connected in series to a transmission line;

a variable reactance circuit having a gate grounded field effect transistor, having a source electrode connected to said transmission line, where an inductive load is arranged between a drain electrode of said field effect transistor and a ground point, where a negative resistive component of a source input impedance within said transistor is cancelled by a resistive component of said inductive load, said reactance being variable in accordance with a bias voltage; and bias voltage applying means for applying and adjusting said bias voltage, where said bias voltage applying means has a control circuit for applying an adjustable bias voltage to said field effect transistor, said control circuit being supplied with an output from directional coupling means which is connected to an input portion of said transmission line through a detecting means.

11. A circuit according to claim 10, wherein said control circuit comprises:

phase comparing means for receiving an output from said detecting means;

integrating means for integrating an output from said phase comparing means;

first adding means for adding an output from said integrating means to a low-frequency oscillation signal; and second adding means for adding an initial bias voltage to an output from said first adding means, where said control circuit supplies an output from said second adding means to said phase comparing means as a comparison signal, and the output from said second adding means is supplied as an adjustable bias voltage to said field effect transistor of said variable reactance circuit.

* * * * *